(12) United States Patent
Chiba

(10) Patent No.: US 7,391,269 B2
(45) Date of Patent: Jun. 24, 2008

(54) AMPLIFYING CIRCUIT

(75) Inventor: Tadashi Chiba, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 496 days.

(21) Appl. No.: 11/205,197

(22) Filed: Aug. 17, 2005

(65) Prior Publication Data

US 2006/0071704 A1   Apr. 6, 2006

(30) Foreign Application Priority Data

Sep. 29, 2004   (JP)   ............................. 2004-283063

(51) Int. Cl.
*H03F 3/04* (2006.01)
(52) U.S. Cl. .................. 330/311; 330/277; 330/310; 330/299
(58) Field of Classification Search .................. 330/311, 330/310, 277, 299, 296
See application file for complete search history.

(56) References Cited

U.S. PATENT DOCUMENTS

| | | | |
|---|---|---|---|
| 4,586,004 A * | 4/1986 | Valdez | 330/300 |
| 5,282,039 A * | 1/1994 | Vilard | 348/707 |
| 5,389,892 A | 2/1995 | Embree | |
| 6,175,264 B1 | 1/2001 | Jinbo | |
| 6,496,074 B1 * | 12/2002 | Sowlati | 330/311 |
| 6,535,065 B2 * | 3/2003 | Aoki | 330/284 |
| 6,636,119 B2 * | 10/2003 | Vathulya | 330/311 |
| 6,819,179 B2 * | 11/2004 | Raja et al. | 330/285 |

FOREIGN PATENT DOCUMENTS

| | | |
|---|---|---|
| JP | 07-193441 | 7/1995 |
| JP | 11-265593 | 9/1999 |

* cited by examiner

*Primary Examiner*—Patricia Nguyen
(74) *Attorney, Agent, or Firm*—Studebaker & Brackett PC; Donald R. Studebaker

(57) ABSTRACT

The invention provides an amplifying circuit for reducing electric power consumption at a standby mode time. Therefore, in DMOS and NMOS transistors constituting a cascode amplifier, the gate of the DMOS transistor of an initial stage is biased to a grounding voltage through a resistor, and the source of the DMOS transistor is connected to the output side of an inverter through an inductor. When a control signal is set to a level "H", the output of the inverter becomes a level "L", and the DMOS transistor attains a turning-on state and a sufficient operating electric current is flowed to the cascode amplifier. Thus, an input signal is amplified and is outputted as an output signal. In contrast to this, when the control signal is set to the level "L", the output of the inverter becomes the level "H", and the DMOS transistor attains a turning-off state and the operating electric current of the cascode amplifier is stopped.

8 Claims, 3 Drawing Sheets

AMPLIFYING CIRCUIT

BACKGROUND OF THE INVENTION

1. Field of the Invention

The present invention relates to an electric power consumption reducing technique at a stopping time in an amplifying circuit, particularly, a low noise amplifier used in a high frequency band of a wireless communication system, etc.

2. Description of the Related Art

FIG. 1 is a constructional view of a conventional low noise amplifier (hereinafter called "LNA") for a high frequency.

This LNA is assembled into a high frequency LSI of one chip manufactured by directly forming an active element such as a transistor and a diode and a passive element such as a resistor, an inductor, a capacitor, etc. on a silicon substrate by a CMOS process technique.

This LNA has a capacitor 2 and an inductor 3 constituting a filter circuit for interrupting a direct electric current from an input signal IN given to a node 1, and fetching a signal of a predetermined frequency area. A cascode-connected amplifying section is connected to the output side of this inductor 3. The amplifying section has an N-channel MOS transistor 4 of a depression type of an initial stage (hereinafter called "DMOS") and a normal N-channel MOS transistor (hereinafter called "NMOS") 5 of the next stage. The DMOS 4 has characteristics in which a channel is formed and the DMOS 4 attains a turning-on state by implanting ions into a gate area of the normal NMOS even when a gate bias is 0 V.

The inductor 3 is connected to the gate of the DMOS 4 of the initial stage, and the source of this DMOS 4 is connected to the ground through an inductor 6 for impedance matching. The drain of the DMOS 4 is connected to the source of the NMOS 5 of the next stage. This NMOS 5 is set to a gate grounding type in which the gate of the NMOS 5 is connected to an electric power source voltage VDD. The drain of the NMOS 5 is connected to the electric power source voltage VDD through an inductor 7 for a load, and is also connected to a node 8 for outputting an output signal OUT.

Further, this LNA has a bias generating circuit 9 for generating a negative bias voltage to set the DMOS 4 to a turning-off state and reduce a consumed electric current when an amplifying operation is unnecessary in a standby mode. When a control signal CON is given to the bias generating circuit 9, the bias generating circuit 9 generates a negative voltage approximately able to set the DMOS 4 to the turning-off state. When no control signal CON is given to the bias generating circuit 9, the bias generating circuit 9 outputs a grounding voltage GND. The output side of the bias generating circuit 9 is connected to the gate of the DMOS 4 through a resistor 10.

When the amplifying operation is performed by this LNA, the operation of the bias generating circuit 9 is stopped and the grounding voltage GND is outputted. Thus, the grounding voltage GND is given as a bias voltage in the gate of the DMOS 4 through the resistor 10, and this DMOS 4 attains the turning-on state.

A direct current component and a signal of an unnecessary area are removed from the input signal IN inputted to the node 1 through the capacitor 2 and the inductor 3, and this input signal IN is given to the gate of the DMOS 4. This input signal is then amplified by the cascode amplifier using the DMOS 4 and the NMOS 5, and an output signal OUT is outputted from the node 8.

On the other hand, for example, when a transmitter-receiver is transmitting a signal and no amplifying operation using the LNA is required, the bias generating circuit 9 is operated by the control signal CON and generates a negative voltage. The output voltage of the bias generating circuit 9 is applied to the gate of the DMOS 4 through the resistor 10. Thus, the electric current flowed to the DMOS 4 and the NMOS 5 of the cascode amplifier is stopped and the consumed electric current is reduced.

There are Japanese Patent Kokai No. 7-193441 (patent document 1), Japanese Patent Kokai No. 11-265593 (patent document 2), etc. as the prior art.

The above LNA has the bias generating circuit 9 for generating the negative voltage to set the DMOS 4 to the turning-off state. A circuit utilizing a charge pump is normally used in the bias generating circuit 9. However, problems exist in that the circuit construction is large-sized in the charge pump, and self electric power consumption of the charge pump itself is also increased. For example, in a negative voltage charge pump of the above patent literature 2, four transistor elements and four diode elements are used and three capacitor elements are used.

SUMMARY OF THE INVENTION

An object of the present invention is to provide an amplifying circuit able to reduce the electric power consumption at the standby mode time by a simple circuit construction.

An amplifying circuit of the present invention is characterized in that the amplifying circuit is formed on a semiconductor substrate and comprises:

a DMOS transistor in which a grounding voltage is given to the gate of the DMOS transistor through a resistor together with an input signal;

a MOS transistor in which the source of this MOS transistor is connected to the drain of said DMOS transistor, and an electric power source voltage is given to the gate of this MOS transistor, and the drain of this MOS transistor is connected to an output node, and the electric power source voltage is applied to the drain of this MOS transistor through a load impedance; and a logical gate for giving a voltage according to the electric power source voltage or the grounding voltage to the source of said DMOS transistor in accordance with a control signal for controlling an amplifying operation.

In the present invention, the turning on and off operations of this DMOS transistor are controlled by giving the voltage according to the electric power source voltage or the grounding voltage outputted from the logical gate to the source of the DMOS transistor in accordance with the control signal. Thus, for example, there is an effect able to reduce a consumed electric current of the amplifying circuit at a standby mode time by the logical gate of a simple construction as in a CMOS inverter.

Another amplifying circuit of the present invention comprises:

a first DMOS transistor in which a grounding voltage is given to the gate of the first DMOS transistor through a first resistor together with an input signal;

an NMOS transistor in which the source of this NMOS transistor is connected to the drain of said first DMOS transistor, and an electric power source voltage is given to the gate of this NMOS transistor, and the drain of this NMOS transistor is connected to an internal node, and the electric power source voltage is applied to the drain of this NMOS transistor through a first load impedance;

a second DMOS transistor in which the gate of this second DMOS transistor is connected to said internal node through a capacitor, and a grounding voltage is applied to the gate of the second DMOS transistor through a second resistor, and the drain of the second DMOS transistor is connected to an output node, and the electric power source voltage is applied to the drain of the second DMOS transistor through a second load impedance; and a logical gate for giving a voltage according to the electric power source voltage or the grounding voltage to the sources of said first and second DMOS transistors in accordance with a control signal for controlling an amplifying operation; wherein the first DMOS transistor, the NMOS transistor, the second DMOS transistor and the logical gate are arranged on a silicon substrate, a SOI (Silicon On Insulator) substrate or a SOS (Silicon On Sapphire) substrate. The logical gate is set to a CMOS inverter constructed by NMOS and PMOS transistors, and inverting the control signal and outputting the voltage according to the electric power source voltage or the grounding voltage.

DESCRIPTION OF THE PREFERRED EMBODIMENTS

Figure 1:
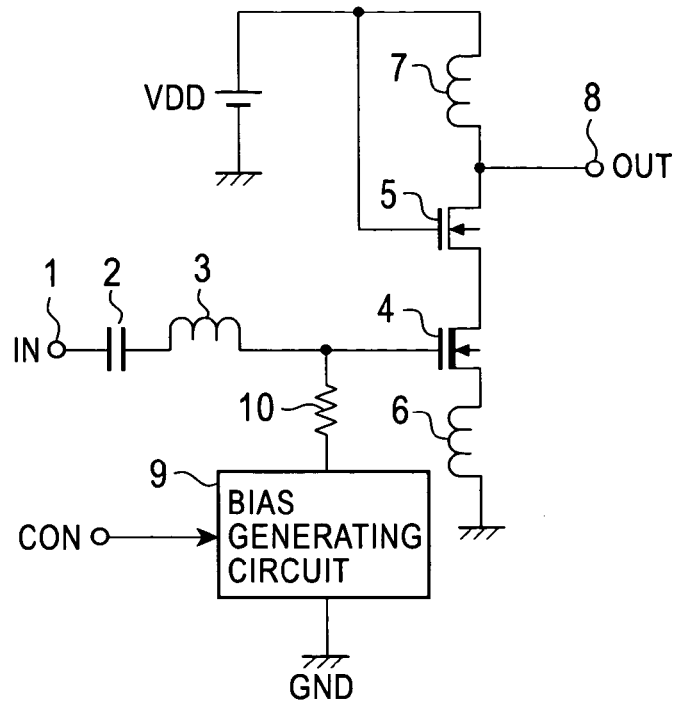
FIG. 1 is a constructional view of a conventional LNA for a high frequency.
Figure 2:
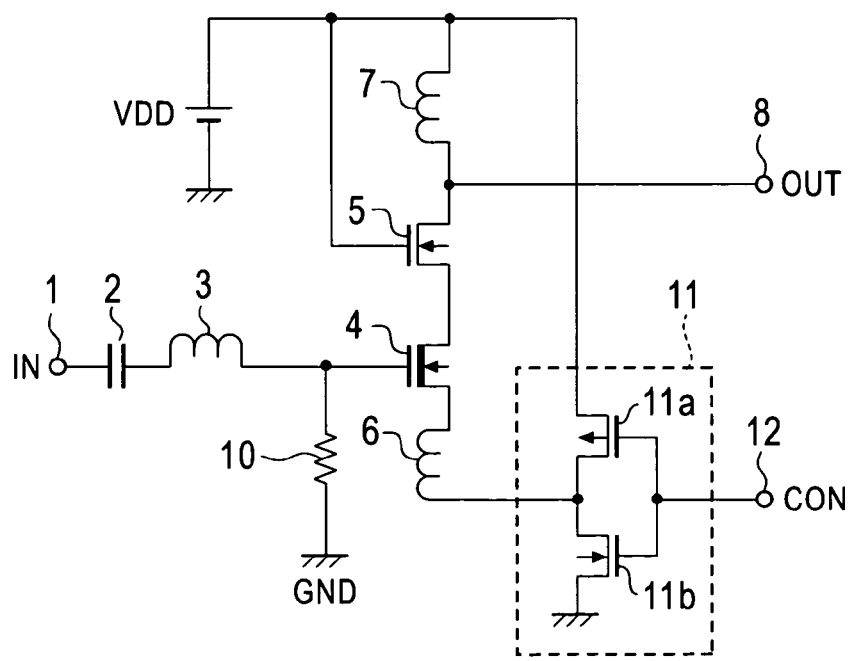
FIG. 2 is a constructional view of an LNA for a high frequency showing an embodiment 1 of the present invention.

FIG. 2 is a constructional view of an LNA for a high frequency showing an embodiment 1 of the present invention. Reference numerals common to those in FIG. 1 are designated in elements common to those within FIG. 1.

This LNA is assembled into a high frequency LSI of one chip manufactured by directly forming an active element such as a transistor and a diode and a passive element such as a resistor, an inductor, a capacitor, etc. on a SOI substrate or a SOS substrate forming a silicon thin film on the surfaces of a silicon substrate and an insulating substrate of quartz and sapphire by a CMOS process technique.

Similar to the LNA of FIG. 1, this LNA has a capacitor 2 and an inductor 3 constituting a filter circuit for interrupting a direct electric current from an input signal IN given to a node 1 and fetching a signal of a predetermined frequency area. A cascode-connected amplifying section is connected to the output side of this inductor 3. The amplifying section has a DMOS 4 of an initial stage and a normal NMOS 5 of the next stage.

The inductor 3 is connected to the gate of the DMOS 4 of the initial stage, and a grounding voltage GND is applied to the gate of this DMOS 4 through a resistor 10. The drain of the DMOS 4 is connected to the source of the NMOS 5 of the next stage. This NMOS 5 is set to a gate grounding type in which the gate of the NMOS 5 is connected to a voltage power source VDD. The drain of the NMOS 5 is connected to the voltage power source VDD through an inductor 7 as a load impedance, and is also connected to a node 8. An output signal OUT is outputted from this node 8.

This LNA has an inverter 11 instead of the bias generating circuit 9 within FIG. 1. This inverter 11 is a general CMOS inverter constructed by combining a PMOS 11a and an NMOS 11b, and is operated by supplying the electric power source voltage VDD to this inverter 11. The inverter 11 inverts and outputs a control signal CON given to a node 12. The output side of the inverter 11 is connected to the source of the DMOS 4 through an inductor 6.

The operation of the amplifying circuit will next be explained.

When an amplifying operation is performed by this LNA, the control signal CON given to the node 12 is set to a level "H". Thus, a level "L" is outputted on the output side of the inverter 11. The actual voltage of the level "L" is determined by the resistance amount between the source and the drain of the NMOS 11b attaining a turning-on state, and an electric current flowed therebetween, but is generally about 100 mV. This value can be optimized by channel widths and channel lengths of the PMOS 11a and the NMOS 11b constituting the inverter.

A voltage of about 100 mV is applied to the source of the DMOS 4 of the cascode amplifier through the inductor 6. A bias voltage of the grounding voltage GND (=0 V) is applied to the gate of the DMOS 4 by a resistor 10. Thus, for example, when the electric power source voltage VDD is set to 0.5 V, an optimum operating electric current (e.g., 2 to 5 mA) is flowed to this cascode amplifier.

On the other hand, a direct current component and a signal of an unnecessary band are removed from the input signal IN of e.g., 2.4 GHz inputted to the node 1 through the capacitor 2 and the inductor 3, and this input signal IN is given to the gate of the DMOS 4. This signal is then amplified by the cascode amplifier using the DMOS 4 and the NMOS 5, and the output signal OUT is outputted from the node 8.

Figure 3:
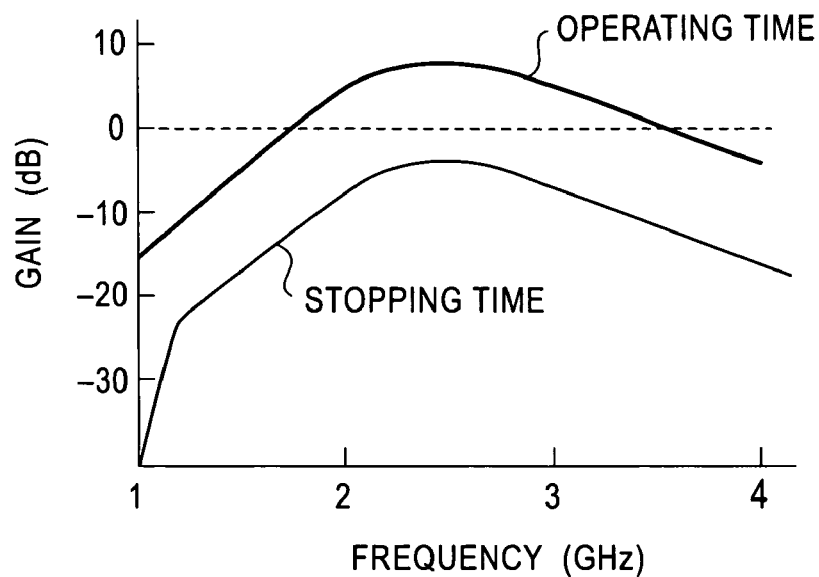
FIG. 3 is a characteristic view showing one example of frequency-gain characteristics of the LNA of FIG. 2.

FIG. 3 is a characteristic view showing one example of frequency-gain characteristics of the LNA of FIG. 2. The axis of abscissa shows the frequency, and the axis of ordinate shows the gain. A thick line within FIG. 3 shows the characteristics at an operating time when the control signal CON is set to "H". A thin line in FIG. 3 shows the characteristics at a stopping time when the control signal CON is set to "L". Thus, sufficient gain characteristics can be obtained in an operating state of the LNA.

Next, for example, when the amplifying operation using the LNA is not required and is stopped by setting this LNA to a standby mode since a transmitter-receiver is transmitting a signal, the control signal CON given to the node 12 is set to "L". Thus, the voltage level "H" is outputted to the output side of the inverter 11. The actual voltage of the level "H" is determined by the resistance amount between the source and the drain of the PMOS 11a attaining a turning-on state, and an electric current flowed therebetween. However, when the electric power source voltage VDD is set to 0.5 V, this actual voltage becomes about 300 mV. This value can be optimized by the channel widths and the channel lengths of the PMOS 11a and the NMOS 11b constituting the inverter. The output voltage (about 300 mV) of the inverter 11 is given to the source of the DMOS 4 of the cascode amplifier through the inductor 6. Since the grounding voltage GND is given to the gate of the DMOS 4 by a resistor 6, the gate of this DMOS 4 attains a state biased by a negative voltage. Thus, the electric current flowed to the DMOS 4 and the NMOS 5 of the cascode amplifier is stopped by leaving a slight leak electric current (e.g., about 200 μA), and the consumed electric current is greatly reduced.

As mentioned above, the LNA of this embodiment 1 is constructed so as to give the output voltage of the inverter 11 to the source of the DMOS 4 of the cascode amplifier. Thus, the consumed electric current at the operation stopping time can be greatly reduced by turning on and off the electric current flowed to the LNA by the control signal CON given to the inverter 11. Further, since no bias voltage of the gate of the DMOS 4 as in the conventional example of FIG. 2 is controlled, there are advantages in that no complicated circuit such as the bias generating circuit is required and the amplifying circuit can be realized by a simple circuit construction as in the inverter 11.

The value of the electric power source voltage VDD, the frequency of the input signal IN, the circuit construction of the inductor, the capacitor, etc. explained in this embodiment 1 are one example. The LNA of a multiple stage construction may be also formed by connecting a similar LNA to the node 8. Further, the present invention is not limited to the high frequency low noise amplification, but can be also applied to an amplifying circuit requiring a reduction in electric power consumption at the standby mode time.

Figure 4:
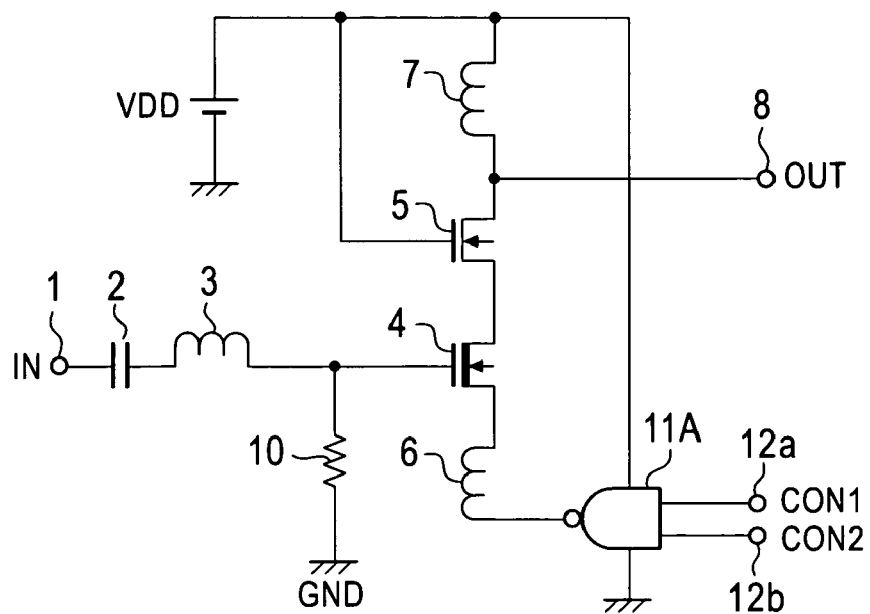
FIG. 4 is a constructional view of an LNA for a high frequency showing an embodiment 2 of the present invention.

FIG. 4 is a constructional view of an LNA for a high frequency showing an embodiment 2 of the present invention. Reference numerals common to those in FIG. 1 are designated in elements common to those within FIG. 1.

In this LNA, a NAND gate 11A of two inputs is arranged instead of the inverter 11 within FIG. 1. The NAND gate 11A inverts and outputs a logical product of control signals CON, CON2 given to nodes 12a, 12b. The other constructions are similar to those of FIG. 1.

The operation of this LNA is similar to the operation of the LNA of FIG. 1 except that the operating state is controlled by combining the control signals CON, CON2. Accordingly, this LNA has advantages similar to those of the LNA of FIG. 1. Other logical gates can be used instead of the NAND gate 11A.

Figure 5:
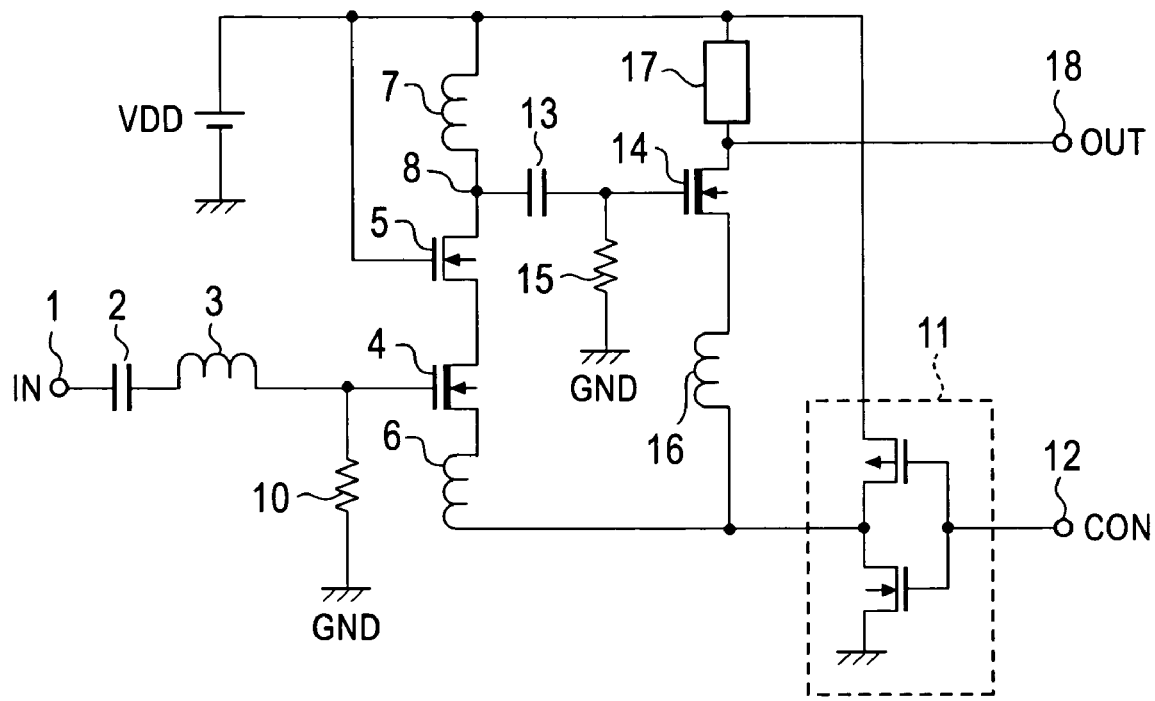
FIG. 5 is a constructional view of an LNA for a high frequency showing an embodiment 3 of the present invention.

FIG. 5 is a constructional view of an LNA for a high frequency showing an embodiment 3 of the present invention. Reference numerals common to those in FIG. 1 are designated in elements common to those within FIG. 1.

In this LNA, an amplifying section using a DMOS 14 is connected to the node 8 in the LNA of FIG. 1 through a capacitor 13. Namely, one end of the capacitor 13 is connected to the node 8, and the other end is connected to the gate of the DMOS 14. A grounding voltage GND is applied to the gate of the DMOS 14 through a resistor 15, and the source of the DMOS 14 is connected to the output side of the inverter 11 through an inductor 16. Further, an electric power source voltage VDD is applied to the drain of the DMOS 14 through a load impedance 17, and this drain of the DMOS 14 is connected to a node 18. An output signal OUT is outputted from this node 18. The other constructions are similar to those of FIG. 1.

The operation of this amplifying circuit will next be explained.

When the amplifying operation is performed by this LNA, similar to the LNA of FIG. 1, the control signal CON given to the node 12 is set to a level "H". Thus, a level "L" is outputted to the output side of the inverter 11, and a voltage of about 100 mV is applied to the source of the DMOS 4 of the cascode amplifier through the inductor 6. A voltage of about 100 mV is also applied to the source of the DMOS 14 through the inductor 16. Since a bias voltage of the grounding voltage GND is respectively applied to the gates of the DMOSs 4, 14 by the resistors 10, 15, an optimum operating electric current flows to the cascode amplifier and the DMOS 14.

On the other hand, a direct current component and a signal of an unnecessary band are removed from the input signal IN of e.g., 2.4 GHz inputted to the node 1 through the capacitor 2 and the inductor 3. This input signal IN is then given to the gate of the DMOS 4. This signal is then amplified by the cascode amplifier using the DMOS 4 and the NMOS 5, and is outputted to the node 8. The signal of the node 8 is further amplified by the DMOS 14, and the output signal OUT is outputted from the node 18.

Figure 6:
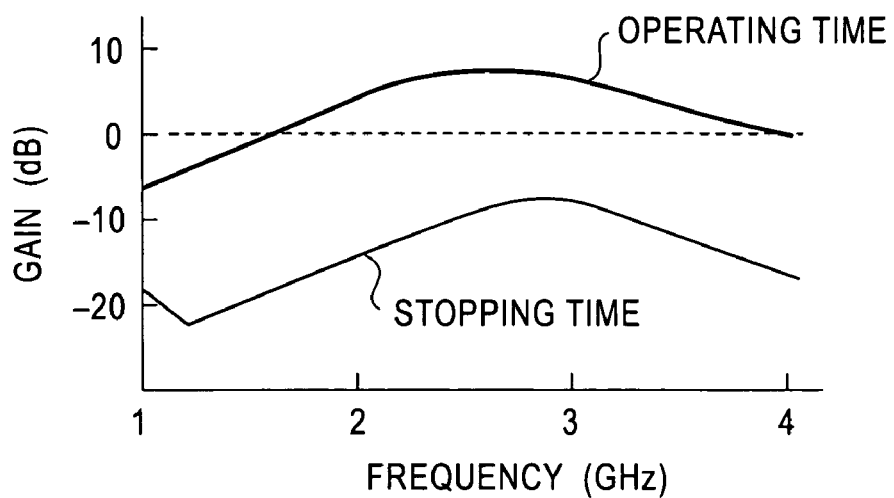
FIG. 6 is a characteristic view showing one example of the frequency-gain characteristics of the LNA of FIG. 5.

FIG. 6 is a characteristic view showing one example of the frequency-gain characteristics of the LNA of FIG. 5. The axis of abscissa shows the frequency, and the axis of ordinate shows the gain. A thick line within FIG. 6 shows the characteristics at the operating time, and a thin line shows the characteristics at the stopping time. Thus, sufficient gain characteristics can be obtained in the operating state of the LNA.

Next, when the LNA is set to the standby mode and the amplifying operation is stopped, the control signal CON given to the node 12 is set to a level "L". Thus, a level "H" is outputted to the output side of the inverter 11. When the electric power source voltage VDD is set to 0.5 V, the actual voltage of the level "H" becomes about 300 mV. The output voltage of the inverter 11 is given to the source of the DMOS 4 of the cascode amplifier through the inductor 6, and is also given to the source of the DMOS 14 through the inductor 16. Since the grounding voltage GND is respectively given to the gates of the DMOSs 4, 14 by the resistors 6, 16, the gates of these DMOSs 4, 14 attain a state biased by a negative voltage. Thus, the electric currents flowed to the cascode amplifier and the DMOS 14 are stopped, and the consumed electric current is greatly reduced.

As mentioned above, the LNA of this embodiment 3 is constructed so as to give the output voltage of the inverter 11 to the source of the DMOS 4 of the cascode amplifier and the source of the DMOS 14 of a subsequent stage. Thus, the LNA of this embodiment 3 has advantages similar to those of the embodiment 1.

This application is based on Japanese Patent Application No. 2004-283063 which is hereby incorporated by reference.

What is claimed is:

1. An amplifying circuit formed on a semiconductor substrate and comprising:
    a depression type MOS transistor in which a grounding voltage is given to the gate of the depression type MOS transistor through a resistor together with an input signal;
    a MOS transistor in which the source of this MOS transistor is connected to the drain of said depression type MOS transistor, and an electric power source voltage is given to the gate of this MOS transistor, and the drain of this MOS transistor is connected to an output node, and the electric power source voltage is applied to the drain of this MOS transistor through a load impedance; and
    a logical gate for giving a voltage according to the electric power source voltage or the grounding voltage to the source of said depression type MOS transistor in accordance with a control signal for controlling an amplifying operation.

2. An amplifying circuit formed on a semiconductor substrate and comprising:
    a first depression type MOS transistor in which a grounding voltage is given to the gate of the first depression type MOS transistor through a first resistor together with an input signal;
    a MOS transistor in which the source of this MOS transistor is connected to the drain of said first depression type MOS transistor, and an electric power source voltage is given to the gate of this MOS transistor, and the drain of this MOS transistor is connected to an internal node, and the electric power source voltage is applied to the drain of this MOS transistor through a first load impedance;

a second depression type MOS transistor in which the gate of this second depression type MOS transistor is connected to said internal node through a capacitor, and a grounding voltage is applied to the gate of the second depression type MOS transistor through a second resistor, and the drain of the second depression type MOS transistor is connected to an output node, and the electric power source voltage is applied to the drain of the second depression type MOS transistor through a second load impedance; and a logical gate for giving a voltage according to the electric power source voltage or the grounding voltage to the sources of said first and second depression type MOS transistors in accordance with a control signal for controlling an amplifying operation.

3. The amplifying circuit according to claim 1, wherein said logical gate is a CMOS inverter constructed by an N-channel MOS transistor and a P-channel MOS transistor, and inverting said control signal and outputting the voltage according to the electric power source voltage or the grounding voltage.

4. The amplifying circuit according to claim 2, wherein said logical gate is a CMOS inverter constructed by an N-channel MOS transistor and a P-channel MOS transistor, and inverting said control signal and outputting the voltage according to the electric power source voltage or the grounding voltage.

5. The amplifying circuit according to claim 1, wherein said semiconductor substrate is a semiconductor substrate in which a silicon thin film is formed on the surface of an insulating substrate of quartz or sapphire.

6. The amplifying circuit according to claim 2, wherein said semiconductor substrate is a semiconductor substrate in which a silicon thin film is formed on the surface of an insulating substrate of quartz or sapphire.

7. The amplifying circuit according to claim 3, wherein said semiconductor substrate is a semiconductor substrate in which a silicon thin film is formed on the surface of an insulating substrate of quartz or sapphire.

8. The amplifying circuit according to claim 4, wherein said semiconductor substrate is a semiconductor substrate in which a silicon thin film is formed on the surface of an insulating substrate of quartz or sapphire.

* * * * *